(12) United States Patent
Tang et al.

(10) Patent No.: US 10,985,157 B2
(45) Date of Patent: Apr. 20, 2021

(54) ELECTROSTATIC DISCHARGE PROTECTION DEVICE AND LAYOUT DESIGN THEREOF

(71) Applicant: ELITE SEMICONDUCTOR MEMORY TECHNOLOGY INC., Hsinchu (TW)

(72) Inventors: Chien-Shao Tang, Hsinchu (TW); Ting-Jui Lin, Hsinchu (TW); Hsiang-Ming Chou, Hsinchu (TW); Fang-Yu Chang, Hsinchu (TW)

(73) Assignee: ELITE SEMICONDUCTOR MEMORY TECHNOLOGY INC., Hsinchu (TW)

( * ) Notice: Subject to any disclaimer, the term of this patent is extended or adjusted under 35 U.S.C. 154(b) by 0 days.

(21) Appl. No.: 16/575,525

(22) Filed: Sep. 19, 2019

(65) Prior Publication Data

US 2021/0091070 A1    Mar. 25, 2021

(51) Int. Cl.
*H01L 29/45*    (2006.01)
*H01L 27/02*    (2006.01)
*H01L 29/08*    (2006.01)

(52) U.S. Cl.
CPC ...... *H01L 27/0296* (2013.01); *H01L 27/0207* (2013.01); *H01L 29/456* (2013.01); *H01L 29/0847* (2013.01)

(58) Field of Classification Search
CPC ............ H01L 27/0296; H01L 27/0207; H01L 29/456
USPC ......................................................... 257/355
See application file for complete search history.

(56) References Cited

U.S. PATENT DOCUMENTS

| 6,064,095 | A | 5/2000 | Fu |
| 9,385,116 | B2 | 7/2016 | Abessolo Bidzo et al. |
| 2002/0175377 | A1* | 11/2002 | Lin ..................... H01L 29/0847 257/355 |

* cited by examiner

*Primary Examiner* — Elias Ullah
(74) *Attorney, Agent, or Firm* — Schmeiser, Olsen & Watts, LLP

(57) ABSTRACT

An electrostatic discharge (ESD) protection device for a semiconductor device that includes a gate, a source including a silicide portion having a plurality of source contacts, and a drain including a silicide portion having a plurality of drain contacts, wherein the source and drain are extended away from the gate along a device axis. The ESD device includes a resist protective oxide (RPO) portion located on the semiconductor device in between the plurality of drain contacts and in between the plurality of source contacts, respectively.

15 Claims, 1 Drawing Sheet

ELECTROSTATIC DISCHARGE PROTECTION DEVICE AND LAYOUT DESIGN THEREOF

BACKGROUND OF THE INVENTION

1. Field of the Invention

This invention relates to an electrostatic discharge (ESD) protection device on a semiconductor substrate. This invention also relates to making an ESD protection device.

2. Description of the Related Art

Electrostatic discharge (ESD) is the spontaneous and rapid transfer of electrostatic charge between two objects having different electrostatic potentials. Familiar examples of ESD range from the relatively harmless, such as the shock that one might receive after shuffling across a carpet and touching a doorknob, to the extreme, such as a lightning bolt. In the world of electronic devices and in particular integrated circuits (ICs), ESD is a very significant problem. The heat generated by ESD can cause metal to open due to melting, junction electro-thermal shorts, oxide rupture or other serious damage to the IC components. Susceptibility to ESD increases with the shrinking size of technology, and components directly connected to the I/O pads are particularly vulnerable.

In view of the above, ESD protection devices are present in every modern IC. Electrostatic discharge (ESD) protection circuits may provide ESD protection in a number of applications. A variety of different ESD devices are available for use in circuits of this kind They are typically placed in parallel with the circuitry to be protected so that large transient currents caused by ESD events can be safely shunted away. Such devices are sometimes referred to in the industry as ESD "clamps" as the node voltage is clamped to a safe level.

BRIEF SUMMARY OF THE INVENTION

Aspects of the present invention are set out in the accompanying independent and dependent claims. Combinations of features from the dependent claims may be combined with features of the independent claims as appropriate and not merely as explicitly set out in the claims.

According to a first aspect of the invention, an electrostatic discharge (ESD) protection device for a semiconductor device is provided, wherein the semiconductor device includes a gate, a source including a silicide portion having a plurality of source contacts, and a drain including a silicide portion having a plurality of drain contacts, wherein the source and drain are extended away from the gate along a device axis. The ESD protection device comprises: a resist protective oxide (RPO) portion located on the semiconductor device in between the plurality of drain contacts and in between the plurality of source contacts, respectively.

In one embodiment according to the first aspect of the present invention, the RPO portion is never located on the gate of the semiconductor device.

In one embodiment according to the first aspect of the present invention, the RPO portion comprises a plurality of RPO regions, each of the plurality of RPO regions has the same width as the region of the semiconductor where it is located.

In one embodiment according to the first aspect of the present invention, the plurality of RPO regions are located in between the plurality of drain contacts and in between the plurality of source contacts, respectively.

In one embodiment according to the first aspect of the present invention, the plurality of drain contacts of the semiconductor device is grouped into a plurality of drain contact sections, the plurality of RPO regions are located in between each of the plurality of drain contact sections.

In one embodiment according to the first aspect of the present invention, the plurality of source contacts of the semiconductor device is grouped into a plurality of source contact sections, the plurality of RPO regions are located in between each of the plurality of source contact sections.

In one embodiment according to the first aspect of the present invention, the ESD protection device comprises a protection layer for preventing silicidation of the RPO portion during manufacture.

According to a second aspect of the invention, an electrostatic discharge (ESD) protection circuit that includes the ESD protection device according to the above embodiments is provided.

According to a third aspect of the invention, a layout pattern for a semiconductor device that comprises a layout of a gate region, a source region having a plurality of source contacts, and a drain region having a plurality of drain contacts, wherein the source region and drain region are extended away from the gate region along a device axis, is provided. The layout pattern includes a resist protective oxide (RPO) portion partially covers the semiconductor device on the drain region between the plurality of drain contacts, and on the source region between the plurality of source contacts, respectively.

In one embodiment according to the third aspect of the present invention, the RPO region never cover the gate region of the semiconductor device.

In one embodiment according to the third aspect of the present invention, the RPO portion comprises a plurality of RPO regions, each of the plurality of RPO regions has the same width as the region of the semiconductor where it covers.

In one embodiment according to the third aspect of the present invention, the plurality of RPO regions cover the semiconductor device on the drain region between the plurality of drain contacts, and on the source region between the plurality of source contacts, respectively.

In one embodiment according to the third aspect of the present invention, the plurality of drain contacts of the semiconductor device is grouped into a plurality of drain contact sections, the plurality of RPO regions partially cover the drain region in between each of the plurality of drain contact sections.

In one embodiment according to the third aspect of the present invention, the plurality of source contacts of the semiconductor device is grouped into a plurality of source contact sections, the plurality of RPO regions partially cover the source region in between each of the plurality of source contact sections.

In one embodiment according to the third aspect of the present invention, the layout pattern includes a protection region covering the RPO region for preventing silicidation of the RPO region during manufacture.

According to at least one aspect of the present invention, the ESD protection device/circuit provide a RPO layer between drain contacts and between source contacts of the semiconductor device which blocks the silicided diffusion in the semiconductor device, i.e. ESD current on the surface of drain and/or source, coming from an output of the semiconductor device.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE INVENTION

Figure 1:
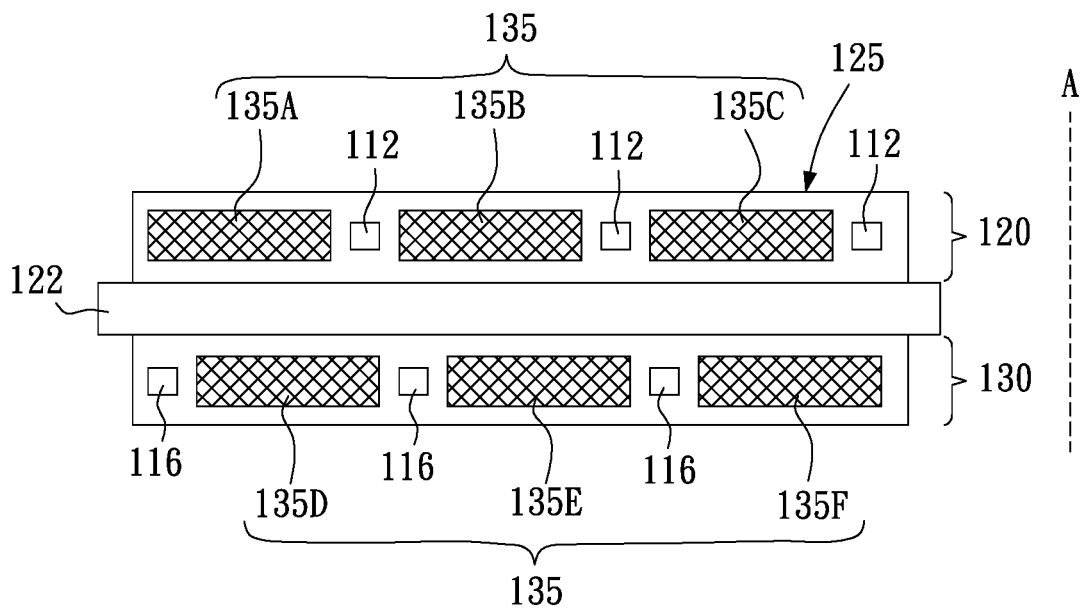
FIG. 1 is a top view of a layout design of an electrostatic discharge protection device for a semiconductor device according to one preferred embodiment of this invention.

FIG. 1 illustrates an electrostatic discharge (ESD) protection device for a semiconductor device in accordance with an embodiment of this invention. The semiconductor device is provided on a semiconductor substrate. The substrate may, for example, comprise silicon. The substrate may have a body region in or on which various parts of the semiconductor device may be located.

The semiconductor device has an active region 125. The active region includes a gate 122, a source 120 and a drain 130. The gate 122, source 120 and drain 130 may be provided at a major surface of the substrate. In this example, the gate 122, source 120 and drain 130 are each elongate and have a long dimension orthogonal to a device axis of the semiconductor device labelled in FIG. 1 by the dashed line labelled A. The device axis is of the semiconductor device the axis along which the source 120 and drain 130 each extend away from the gate 122. In particular, the source 120 may extend away from the gate 122 along the device axis in a first direction and the drain 130 may extend away from the gate 122 in a second direction along the device axis, where the first direction and second direction are generally opposite with each other. The device axis is similarly labelled in the examples described below in relation to FIG. 2.

The active region 125 includes regions that comprise silicide portion and regions that comprises resist protective oxide (RPO) portion 135. In a referred embodiment, the RPO portion can be made from any non-silicide material, however it is not meant for a limitation of the present invention, whose who skilled in the art can adopt any suitable material for the use of making RPO. For example, any dielectric material that can prevent silicon from reacting with metal. The RPO portion 135 further comprises RPO regions 135A~135F and the RPO regions 135A~135F is indicated with cross-hatching in FIG. 1. Outside the cross-hatched area is the semiconductor device that comprises silicide. For example, the source 120 and the drain 130 of the semiconductor device comprise Cobalt-Silicide. However, it will be appreciated that other types of silicide may be used.

The semiconductor device also includes one or more source contacts 112 and one or more drain contacts 116, as shown in FIG. 1. In practice, however, it is envisaged that the semiconductor device is likely to have a plurality of such contacts in order to increase the amount of current that can pass through the semiconductor device.

As can be seen in FIG. 1, each drain contact 116 is laterally offset with respect to its neighboring source contacts 112. For instance, the drain contact 116 in the bottom left-hand side of the device shown in FIG. 1 is offset with respect to the far left source contact 112. Accordingly, it is envisaged that at least in some instances, the area of the source 120 directly opposite an area of the drain 130 in which a drain contact 116 is provided would not be provided with a source contact 112. Similarly, the area of the drain 130 directly opposite the area of the source 120 including a source contact 112 would not be provided with a drain contact 116. This lateral offsetting of the drain contacts 116 with respect to the source contacts 112 is along a direction generally orthogonal to the device axis. It is also envisaged that the source contacts 112 are aligned with their drain-contact counterparts.

As shown in FIG. 1, the ESD protection device 135, i.e. RPO portion, according to one embodiment of the present invention is represented by the cross hatched regions 135A~135F. These RPO regions 135A~135F may be formed during manufacture using an appropriately patterned mask comprising a protection layer of some kind to prevent the RPO regions 135A~135F from silicidation. The devices described below in relation to FIG. 2 may also be manufactured using this method.

As shown in FIG. 1, the RPO region 135 is located on the drain 130 in between the drain contacts 116. The RPO region 135 is also located on the source 120 in between the source contacts 112. Because of this, current flowing laterally within the device as noted above must pass through the RPO region 135. In this way, the increased sheet resistance of the RPO regions 135A~135F (which may, for example, comprise doped silicon or any other suitable material) as compared to, for example, silicide, can provide ballast resistance for the device. This improves the ESD robustness of the device in a manner that does not substantially increase, or even decreases, the size of the device.

It should be noted that, in the present invention, under no circumstances will the RPO regions 135A~135F cover the gate 122 of the semiconductor device. Because if the gate 122 of the semiconductor device were in anyway covered by any of the RPO regions 135A~135F, the covering RPO region will function as a parasitic resistance for the gate 122, and thus slow down the switching of the Metal-Oxide-Semiconductor Field-Effect Transistor (MOSFET) where its gate is covered. This effect is particularly undesirable for larger MOSFETs.

Accordingly, in the example of FIG. 1, the RPO portion 135 is provided as a plurality of separate regions 135A, 135B, 135C, 135D, 135E and 135F. Each section is located between drain contacts 116 or source contacts 112. The width W1 of the regions of the RPO portion 135 may be chosen in accordance with the desired ballast resistance to be achieved. In one preferred embodiment, the width W1 of the regions of the RPO portion 135 is set to be the same as the region where it is located. That is, the RPO regions 135A, 135B, 135C has the width as the source 120 of the semiconductor device, while the RPO regions 135D, 135E, 135F has the width as the drain 130 of the semiconductor device.

Figure 2:
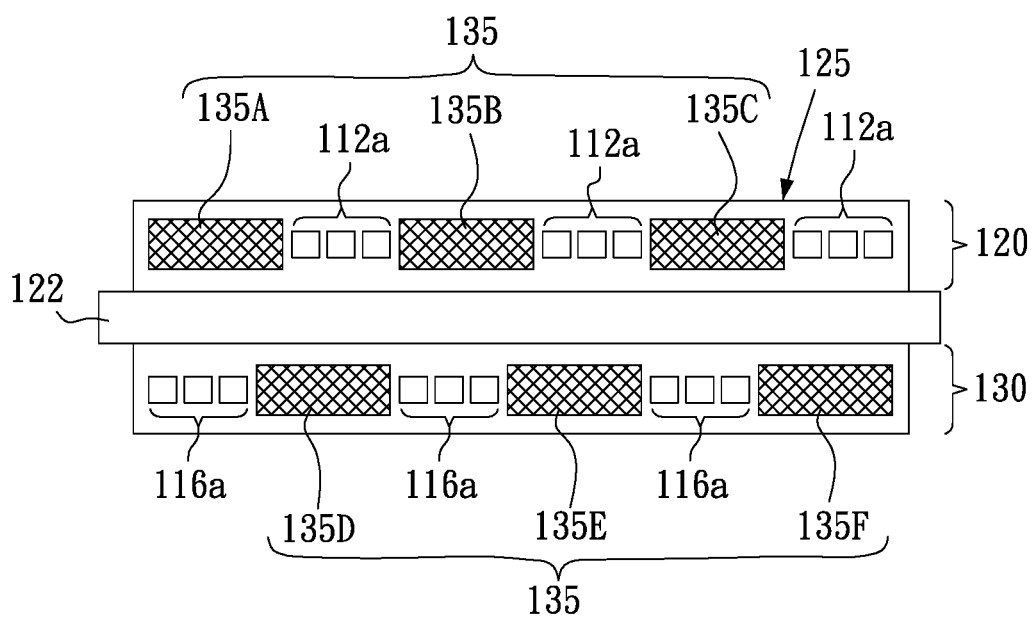
FIG. 2 is top view of a layout design of an electrostatic discharge protection device for a semiconductor device according to another preferred embodiment of this invention.

Please refer to FIG. 2, which is a top view of a layout design of an electrostatic discharge protection device for a semiconductor device according to another preferred embodiment of this invention. As shown in FIG. 2, the semiconductor device to be applied for the ESD protection device in FIG. 2 is substantially the same as the one in FIG. 1. The difference is that the semiconductor device in FIG. 2 has the drain contacts and source contacts further grouped into plurality of drain contact sections 112a and plurality of source contact sections 116a, respectively. Each drain contact section 112a includes multiple drain contacts while each source contact section 116a includes multiple source contacts.

In FIG. 2, the ESD protection device 135, i.e. the RPO portion also comprises a plurality of RPO regions 135A~135F. The RPO regions 135A~135C are located between the drain contact sections 112a while The RPO regions 135D~135F are located between the source contact sections 116a.

Like the ESD protection device in FIG. 1, in this embodiment, the ESD protection device 135 also never covers the gain region of the semiconductor device in order not to cause any delay in switching due to the parasitic resistance accompanied by the RPO portion 135 that covers the gate region.

Accordingly, there has been described an ESD protection device for a semiconductor device formed on a semiconductor substrate and a layout pattern thereof. In certain embodiments, the present invention also provides ESD protection circuits that utilized the ESD protection device described above. For example, one skilled in the art may employ a MOSFET which is applied by the ESD protection device according to the present invention as a switch circuit.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Although omitted for conciseness, the preferred embodiments include every combination and permutation of the various methods, apparatus, and systems described herein.

As a person skilled in the art will recognize from the previous detailed description and from the figures and claims, modifications and changes can be made to the preferred embodiments of the invention without departing from the scope of this invention defined in the following claims.

What is claimed is:

1. An electrostatic discharge (ESD) protection device for a semiconductor device that comprises a gate, a source including a silicide portion having a plurality of source contacts, and a drain including a silicide portion having a plurality of drain contacts, wherein the source and drain are extended away from the gate along a device axis, the ESD discharge device comprises:
a resist protective oxide (RPO) portion located in parallel on the drain in between the plurality of drain contacts and perpendicular to the device axis, and located in parallel on the source in between the plurality of source contacts and perpendicular to the device axis.

2. The ESD protection device of claim 1, wherein the RPO portion is never located on the gate of the semiconductor device.

3. The ESD protection device of claim 1, wherein the RPO portion comprises a plurality of RPO regions, each of the plurality of RPO regions has the same width as the region of the semiconductor where it is located.

4. The ESD protection device of claim 3, wherein the plurality of RPO regions are located in between the plurality of drain contacts and in between the plurality of source contacts, respectively.

5. The ESD protection device of claim 3, wherein the plurality of drain contacts of the semiconductor device is grouped into a plurality of drain contact sections, the plurality of RPO regions are located in between each of the plurality of drain contact sections.

6. The ESD protection device of claim 3, wherein the plurality of source contacts of the semiconductor device is grouped into a plurality of source contact sections, the plurality of RPO regions are located in between each of the plurality of source contact sections.

7. The ESD protection device of claim 1 comprising a protection layer for preventing silicidation of the RPO portion during manufacture.

8. An electrostatic discharge (ESD) protection circuit comprising the device of claim 1.

9. A layout pattern for a semiconductor device that comprises a layout of a gate region, a source region having a plurality of source contacts, and a drain region having a plurality of drain contacts, wherein the source region and drain region are extended away from the gate region along a device axis, the layout pattern comprises:
a resist protective oxide (RPO) portion partially covers the semiconductor device on the drain region between the plurality of drain contacts and perpendicular to the device axis, and on the source region between the plurality of source contacts and perpendicular to the device axis, respectively.

10. The layout pattern of claim 9, wherein the RPO portion never cover the gate region of the semiconductor device.

11. The layout pattern of claim 9, wherein the RPO portion comprises a plurality of RPO regions, each of the plurality of RPO regions has the same width as the region of the semiconductor device where it covers.

12. The layout pattern of claim 10, wherein the plurality of RPO regions cover the semiconductor device on the drain region between the plurality of drain contacts, and on the source region between the plurality of source contacts, respectively.

13. The layout pattern of claim 10, wherein the plurality of drain contacts of the semiconductor device is grouped into a plurality of drain contact sections, the plurality of RPO regions partially cover the drain region in between each of the plurality of drain contact sections.

14. The layout pattern of claim 10, wherein the plurality of source contacts of the semiconductor device is grouped into a plurality of source contact sections, the plurality of RPO regions partially cover the source region in between each of the plurality of source contact sections.

15. The layout pattern of claim 9 comprising a protection region covering the RPO region for preventing silicidation of the RPO region during manufacture.

* * * * *